(12) United States Patent
Ha et al.

(10) Patent No.: US 10,559,640 B2
(45) Date of Patent: Feb. 11, 2020

(54) ORGANIC LIGHT EMITTING DIODE DISPLAY DEVICE

(71) Applicant: LG Display Co., Ltd., Seoul (KR)

(72) Inventors: Sung-Chul Ha, Paju-si (KR); Pil-Sung Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/637,687

(22) Filed: Jun. 29, 2017

(65) Prior Publication Data

US 2018/0006101 A1 Jan. 4, 2018

(30) Foreign Application Priority Data

Jun. 30, 2016 (KR) .................. 10-2016-0082651

(51) Int. Cl.
*H01L 27/32* (2006.01)
*H01L 51/50* (2006.01)

(52) U.S. Cl.
CPC .......... *H01L 27/3262* (2013.01); *H01L 27/32* (2013.01); *H01L 51/5056* (2013.01); *H01L 51/508* (2013.01); *H01L 51/5096* (2013.01)

(58) Field of Classification Search
CPC . H01L 27/3262; H01L 27/32; H01L 51/5056; G09G 5/006; G09G 5/18; G09G 3/32; G09G 3/006; G09G 3/3233; G09G 3/325; G06F 3/0418
USPC ............................................................ 345/102
See application file for complete search history.

(56) References Cited

U.S. PATENT DOCUMENTS

| | | | | |
|---|---|---|---|---|
| 9,601,089 B2* | 3/2017 | Choi | ........................ | G09G 5/18 |
| 10,096,281 B2* | 10/2018 | An | ........................ | G09G 3/3233 |
| 2007/0229434 A1* | 10/2007 | Liao | ........................ | G09G 3/20 |
| | | | | 345/98 |
| 2011/0205250 A1* | 8/2011 | Yoo | ........................ | G09G 3/3233 |
| | | | | 345/690 |
| 2012/0166896 A1* | 6/2012 | Oh | ........................ | G09G 5/008 |
| | | | | 714/705 |
| 2012/0256855 A1* | 10/2012 | Chan | ........................ | G06F 3/0418 |
| | | | | 345/173 |
| 2015/0103038 A1* | 4/2015 | Han | ........................ | G06F 3/044 |
| | | | | 345/174 |

(Continued)

FOREIGN PATENT DOCUMENTS

CN 104732918 A 6/2015

OTHER PUBLICATIONS

Office Action dated Jul. 3, 2019 issued in a corresponding Chinese application No. 201710514853.0 (11 pages) and translation (11 pages).

*Primary Examiner* — Fred Tzeng
(74) *Attorney, Agent, or Firm* — Polsinelli PC

(57) ABSTRACT

Disclosed is an organic light emitting diode display device capable of transmitting a sensing value through an EPI interface without a separate line B-LVDS including a display panel having a plurality of gate lines and data lines, a timing controller for controlling an operation timing of each pixel, a gate driver for driving gate lines, a data driver having a plurality of data driving ICs for driving data lines, and an EPI interface between the timing controller and each data driving ICs and for transmitting video/control data signal from the timing controller to each data driving IC, and transmitting a sensing value from the data driving IC to the timing controller.

16 Claims, 13 Drawing Sheets

(56) References Cited

U.S. PATENT DOCUMENTS

| | | | | |
|---|---|---|---|---|
| 2015/0220383 A1* | 8/2015 | Saito | .................. | H04N 19/89 |
| | | | | 714/747 |
| 2015/0310824 A1* | 10/2015 | Yang | .................. | G09G 5/006 |
| | | | | 345/213 |
| 2015/0346887 A1* | 12/2015 | Cho | .................. | G06F 3/0412 |
| | | | | 345/174 |
| 2015/0379909 A1* | 12/2015 | Yu | .................. | G09G 3/006 |
| | | | | 345/690 |
| 2016/0012798 A1* | 1/2016 | Oh | .................. | G09G 3/325 |
| | | | | 345/205 |
| 2016/0034417 A1* | 2/2016 | Chavez | .............. | H04B 3/542 |
| | | | | 710/110 |
| 2016/0062548 A1* | 3/2016 | Kwon | .............. | G06F 3/0418 |
| | | | | 345/173 |
| 2016/0063918 A1* | 3/2016 | Choi | .................. | G09G 3/3233 |
| | | | | 345/214 |
| 2016/0071445 A1* | 3/2016 | Kim | .................. | G09G 3/006 |
| | | | | 345/212 |
| 2016/0189621 A1* | 6/2016 | Kim | .................. | G09G 3/3258 |
| | | | | 345/215 |
| 2016/0189625 A1* | 6/2016 | Kim | .................. | G09G 3/3233 |
| | | | | 345/205 |
| 2016/0259368 A1* | 9/2016 | Bibl | .................. | G06F 3/0412 |
| 2017/0132979 A1* | 5/2017 | Oh | .................. | G09G 3/12 |
| 2017/0187551 A1* | 6/2017 | Lukanc | ............ | H04L 25/03019 |

\* cited by examiner

Manchester code

ORGANIC LIGHT EMITTING DIODE DISPLAY DEVICE

CROSS REFERENCE TO RELATED APPLICATION

This application claims the benefit of Korean Patent Application No. 10-2016-0082651, filed on Jun. 30, 2016, which is hereby incorporated by reference in its entirety as if fully set forth herein.

BACKGROUND

Field of the Disclosure

The present disclosure relates to an organic light emitting diode (OLED) display device, and more particularly, to an organic light emitting diode display device capable of reducing the number of lines between a timing controller and a data driving IC.

Discussion of the Background

Flat panel displays that display images using digital data are typically liquid crystal displays (LCDs) using liquid crystals and OLED display devices using organic light emitting diodes (OLEDs).

Of these, OLED display devices are self-luminous devices that emit organic light-emitting layers by recombination of electrons and holes, and are expected to be the next generation display devices because of their high brightness, low driving voltage and thinness.

FIG. 1 is a configuration diagram of an OLED display device according to the related art.

As shown in FIG. 1, the related art OLED display device includes display panel 1 having a plurality of pixels arranged in a matrix form and defined in a region where a plurality of gate lines GL and data lines DL intersect, a timing controller 4 for aligning video signals inputted from the outside and controlling the operation timing of each pixel, and a gate driver 3 and a data driver 2 for driving gate lines GL and data lines DL provided in the display panel 1 in accordance with signals outputted from the timing controller 4.

Here, the gate driver 3 includes a plurality of gate driving ICs, and the data driver 2 also includes a plurality of data driving ICs.

Each pixel of the display panel 1 includes an OLED element composed of an organic light emitting layer between an anode and a cathode, and a pixel circuit for independently driving the OLED element.

The pixel circuit includes a switching thin film transistor (TFT) TR1 for supplying a data voltage to a storage capacitor Cst according to a scan signal, a driving TFT TR2 for supplying a driving current to the OLED element according to a driving voltage charged in the storage capacitor Cst, and a sensing TFT TR3 for sensing a threshold voltage variation and a mobility variation of the driving TFT. Therefore, the OLED element generates light proportional to a driving current.

In the OLED display device, there is a problem that the driving characteristics (i.e., threshold voltage, mobility, and etc.) of the driving TFT are varied due to a process variation and a change with the passage of time, thereby causing non-uniform luminance. In order to solve this problem, an OLED display uses a compensation method of sensing driving characteristics of each pixel and compensating data to be supplied to each pixel by using the sensed driving characteristics.

In the related art image quality compensation technique, the method and period for sensing the threshold voltage change amount of the driving TFT and the mobility variation amount of the driving TFT are different from each other.

FIG. 2 is a diagram for explaining the related art image quality compensation technique, and FIG. 3A is a graph of a pixel circuit configuration and a time and voltage relationship for explaining a sensing principle for extracting a threshold voltage change of a drive TFT in the related art image quality compensation technique, FIG. 3B is a graph of a pixel circuit configuration and a time and voltage relationship for explaining a sensing principle for extracting a mobility change of a driving TFT in the related art image quality compensation technique.

As shown in FIGS. 2 and 3A, the sensing method for extracting the change in the threshold voltage Vth of the driving TFT is performed by receiving a source voltage Vs of the driving TFT as a sensing voltage VsenA after operating the driving TFT in a source follower manner and then detecting a threshold voltage change amount of the driving TFT based on the sensing voltage VsenA. The threshold voltage change amount of the driving TFT is determined according to the magnitude of the sensing voltage VsenA, thereby obtaining an offset value for data compensation. In this sensing method, since the sensing operation must be performed after the gate-source voltage Vgs of the driving TFT operated in the source follower mode reaches the saturation state, the sensing time is long and the sensing speed is low. This sensing method is referred to as a slow mode sensing method.

As shown in FIGS. 2 and 3B, the sensing method for extracting the change in the mobility μ of the driving TFT is performed by turning on the driving TFT by applying a constant voltage Vdata+X higher than the threshold voltage, in order to define the current capability characteristics excluding the threshold voltage (Vth) of the driving TFT, and receiving the source voltage Vs of the driving TFTs charged for a predetermined time as a sensing voltage VsenB, where X is a voltage in accordance with the offset value compensation. The mobility change amount of the driving TFT is determined according to the magnitude of the sensing voltage VsenB, thereby obtaining a gain value for data compensation. This sensing method is characterized in that the time required for sensing is short and the sensing speed is fast since this sensing method is performed in a state in which the driving TFT is turned on. This sensing method is referred to as a fast mode sensing method.

Since the sensing speed of the slow mode sensing method is slow, a sufficient sensing period is required. That is, the slow mode sensing method for sensing the threshold voltage of the driving TFT must be performed until the driving power is turned off after the image display is completed, in response to the power off command signal from the user, so that the sensing time can be sufficiently allocated without being recognized by the user.

On the other hand, the fast mode sensing method for sensing the mobility of a driving TFT has a high sensing speed. Therefore, the fast mode sensing method may be performed in the vertical blank periods within the display driving period, before the image display is performed after the driving power is turned on in response to the power-on command signal from the user.

In order to sense the driving characteristics of each pixel and to compensate data to be supplied to each pixel using a sensing value, video signal transmission lines for transmitting video signal from the timing controller 4 to the data driver 3 and a separate line B-LVDS for transmitting the sensing value to the timing controller 4 exists between the timing controller 4 and the data driver 3.

FIG. 4 is a block diagram showing the configuration of the related art timing controller 4 and the data drivers 3(3a, 3b and 3c).

The timing controller 4 transmits the video signal to each data driving IC 3a, 3b, and 3c. Of the data driver 3 through an EPI (Embedded Point-to-Point Interface) interface known as a high-speed serial interface. The data driver 3 transmits the sensing value to the timing controller 4 through a separate low voltage differential signal (LVDS) interface. Therefore, the OLED display device requires a separate LVDS interface in addition to the EPI interface in order to transmit the sensing value. Accordingly, the OLED display device has a size of the control PCB larger than that of the liquid crystal display device, and the number of pins of the timing controller of the OLED display device is increased.

SUMMARY

Accordingly, the present disclosure is directed to an organic light emitting display device that substantially obviates one or more problems due to limitations and disadvantages of the prior art.

The present disclosure is to provide an organic light emitting display device capable of transmitting a sensing value through an EPI interface without a separate line B-LVDS.

Additional advantages and features of the disclosure will be set forth in part in the description which follows and in part will become apparent to those having ordinary skill in the art upon examination of the following or may be learned from practice of the invention. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, an organic light emitting display device according to an aspect includes a display panel having a plurality of gate lines and data lines, a timing controller for controlling the operation timing of each pixel, a gate driver for driving gate lines, a data driver having a plurality of data driving ICs for driving data lines, and an EPI interface between the timing controller and each of data driving ICs and for transmitting video/control data signal from the timing controller to each data driving IC, and transmitting a sensing value from the each of data driving IC to the timing controller.

In another aspect of the present disclosure, an organic light emitting display device includes a display panel having a plurality of pixels, gate lines and data lines; a timing controller outputting a video/control data signal; a gate driver driving the gate lines; a data driver driving the data lines and outputting a sensing value of the pixels to compensate for the video/control data signal; and an embedded point-to-point interface connected between the timing controller and the data driver, wherein both of the video/control data signal and the sensing value are respectively transmitted to the data driver and the timing controller through the embedded point-to-point interface.

The each of the data driving ICs includes an oscillator for generating a clock signal for transmitting the sensing value to the timing controller through the EPI interface.

The timing controller includes a first transmission module for transmitting video/control data signal converted into a serial transmission packet to the each of data driving ICs via the EPI interface, a first reception module for receiving the sensing value from the each of data driving ICs via the EPI interface, a first transmission/reception selector for enabling one of the first transmission module and the first reception module, and disabling the other, and a transmission/reception timing controller for controlling the first transmission/reception selector.

Each of data driving ICs includes a second reception module for receiving the video/control data signal from the timing controller through the EPI interface, a clock data recovery unit for restoring video data, control data, and a clock signal from the video/control data signal, an oscillator for generating a clock signal in accordance with the restored control signal, an encoder for encoding a sensing value sensed from the display panel in synchronization with the clock signal generated by the oscillator, a second transmission module for converting the sensing value encoded by the encoder into a transmission packet and transmitting the transmission packet to the timing controller through the EPI interface, a counter for counting the clock signal generated by the oscillator and outputting a control signal when the count value reaches a predetermined value, and a second transmission/reception selector for disabling the second reception module and enabling the second transmission module according to the control signal restored by the control data processing unit, and for disabling the second transmission module and enabling the second reception module according to the control signal of the counter.

Each of data driving ICs further comprises an image data processing unit for processing the image data restored by the clock data recovery unit, a latch unit for latching the image data processed by the image data processing unit, a control data processing unit for processing the control data restored by the clock data recovery unit, and supplying the processed control data to the counter and the oscillator, a DAC for converting the image data latched by the latch unit into an analog image signal according to the control signal processed by the control data processing unit, and an output unit for supplying the analog image signal converted by the DAC to each data line of the OLED panel.

Each of data driving ICs further comprises a sampling unit for sampling the sensing value sensed from the display panel, and an ADC for converting the sensing value sampled by the sampling unit into a digital signal, and supplying the digital sensing value to the encoder.

The organic light emitting display device according to another aspect includes an auxiliary signal line for transferring the control signal from the transmission/reception timing control unit to the each data driving IC, and the each data driving IC includes a second reception module for receiving video/control data signal from the timing controller through the EPI interface, a clock data recovery unit for restoring video data, control data, and a clock signal from the video/control data signal, an oscillator for generating a clock signal in accordance with the control signal restored by the clock data recovery unit, an encoder for encoding a sensing value sensed from the OLED panel in synchronization with the clock signal generated by the oscillator, a second transmission module for converting the sensing value encoded by the encoder into a transmission packet and transmitting the transmission packet to the first reception module of the timing controller through the EPI interface, a second transmission/reception selector for receiving the control signal from the transmission/reception timing controller through the auxiliary signal line, and enabling one of the second reception module and the second transmission module and disabling the other according to the control signal from the transmission/reception timing controller.

The timing controller and each of the data driving ICs communicate with each other via the EPI interface in the Manchester coding scheme.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Reference will now be made in detail to aspects of the disclosure, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the aspects of the disclosure. Names of components used in the following description may be selected in consideration of facility of specification preparation. Thus, the names of the components may be different from names of components used in a real product.

Figure 1:
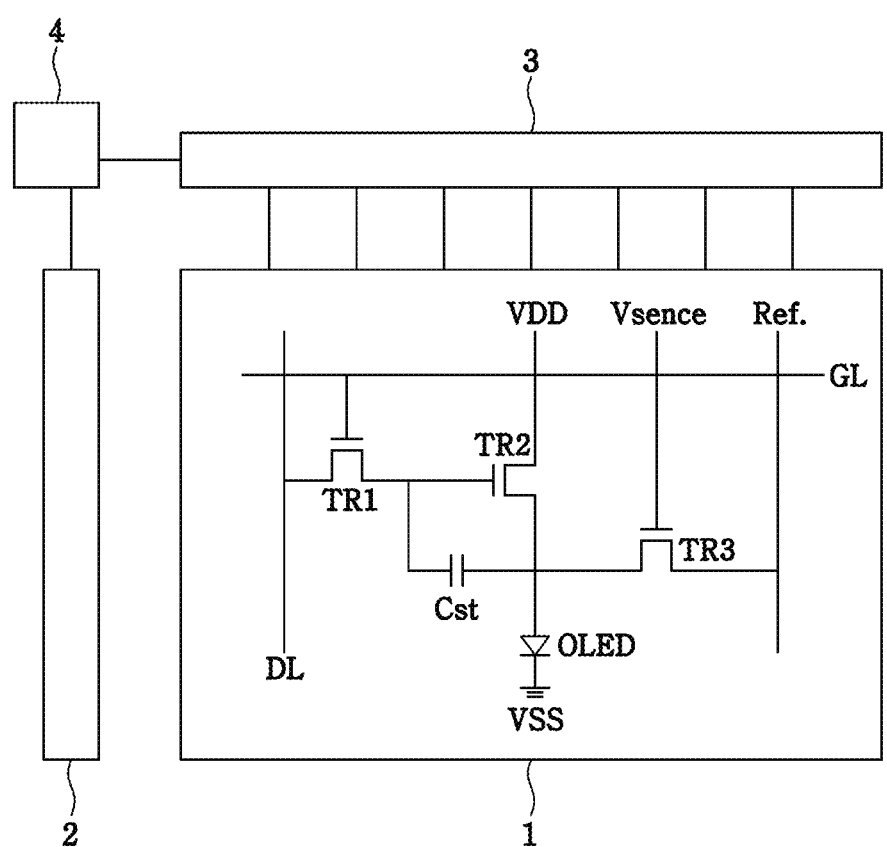
FIG. 1 is a configuration diagram of an OLED display device according to the related art.
Figure 2:
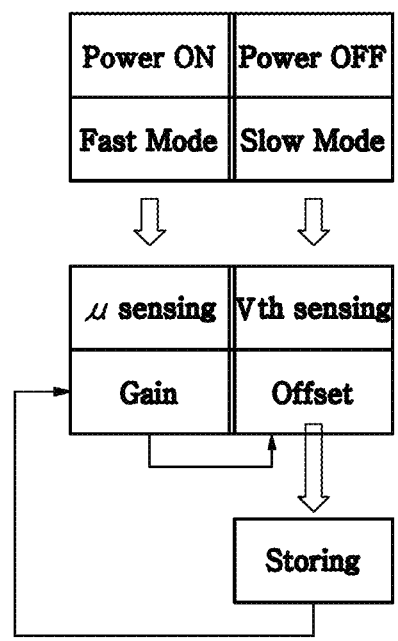
FIG. 2 is a diagram for explaining the related art image quality compensation technique.
Figure 3A:
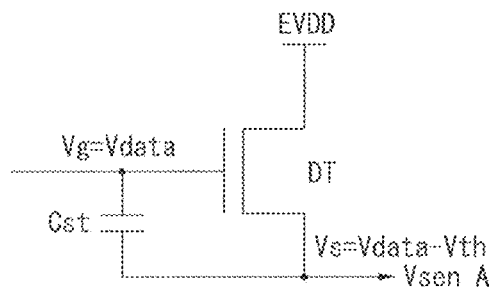
FIG. 3A is a graph of a pixel circuit configuration and a time and voltage relationship for explaining a sensing principle for extracting a threshold voltage change of a drive TFT in the related art image quality compensation technique.
Figure 3A:
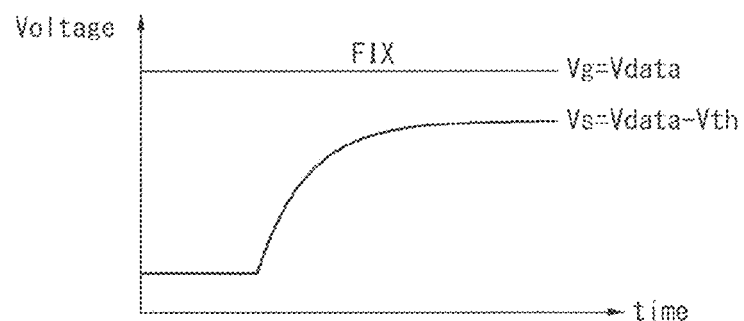
Figure 3B:
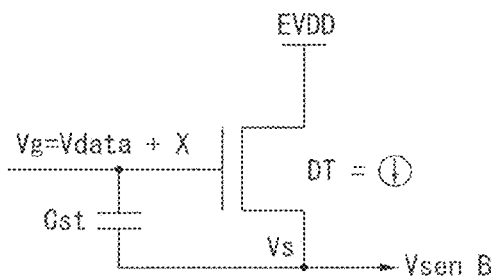
FIG. 3B is a graph of a pixel circuit configuration and a time and voltage relationship for explaining a sensing principle for extracting a mobility change of a driving TFT in the related art image quality compensation technique.
Figure 3B:
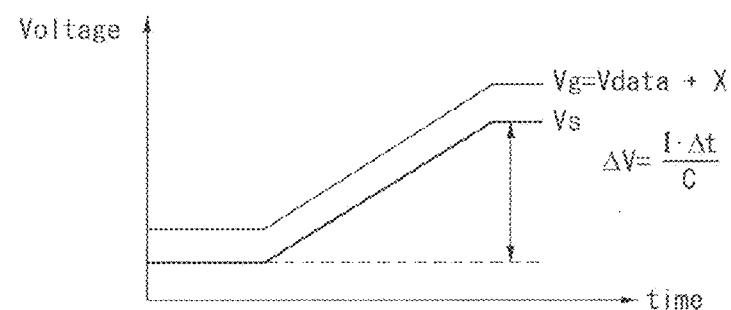
Figure 4:
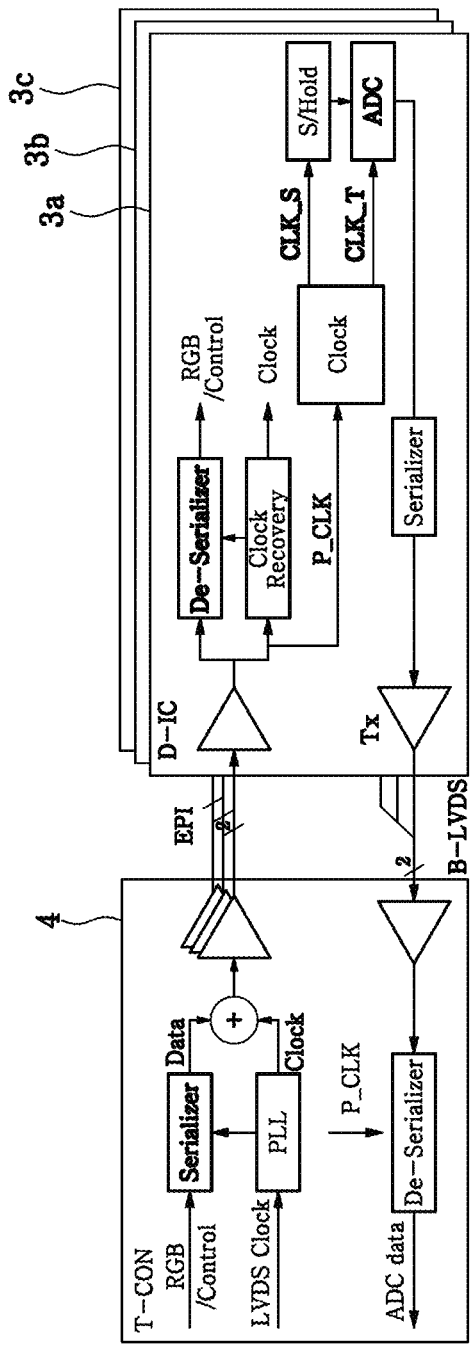
FIG. 4 is a block diagram showing the configuration of the related art timing controller 4 and the data drivers 3 (3a, 3b and 3c)

As shown in FIG. 1, The OLED display according to the related art includes a display panel 1 having a plurality of pixels arranged in a matrix form and defined in a region where a plurality of gate lines GL and data lines DL intersect, a timing controller 4 for aligning video signals inputted from the outside and controlling the operation timing of each pixel, and a gate driver 3 and a data driver 2 for driving gate lines GL and data lines DL provided in the display panel 1 in accordance with signals outputted from the timing controller 4.

Here, the gate driver 3 includes a plurality of gate driving ICs, and the data driver 2 also includes a plurality of data driving ICs Each pixel of the display panel 1 includes an OLED element composed of an organic light emitting layer between an anode and a cathode, and a pixel circuit for independently driving the OLED element.

The pixel circuit includes a switching thin film transistor (TFT) TR1 for supplying a data voltage to a storage capacitor Cost according to a scan signal, a driving TFT TR2 for supplying a driving current to the OLED element according to the data voltage charged in the storage capacitor Cst, and a sensing TFT TR3 for sensing a threshold voltage variation and a mobility variation of the driving TFT. Therefore, the OLED element generates light proportional to a driving current.

However, the configurations of the timing controller and the data driver of the OLED display device of the present disclosure are different from that of the related art OLED display device.

Figure 5:
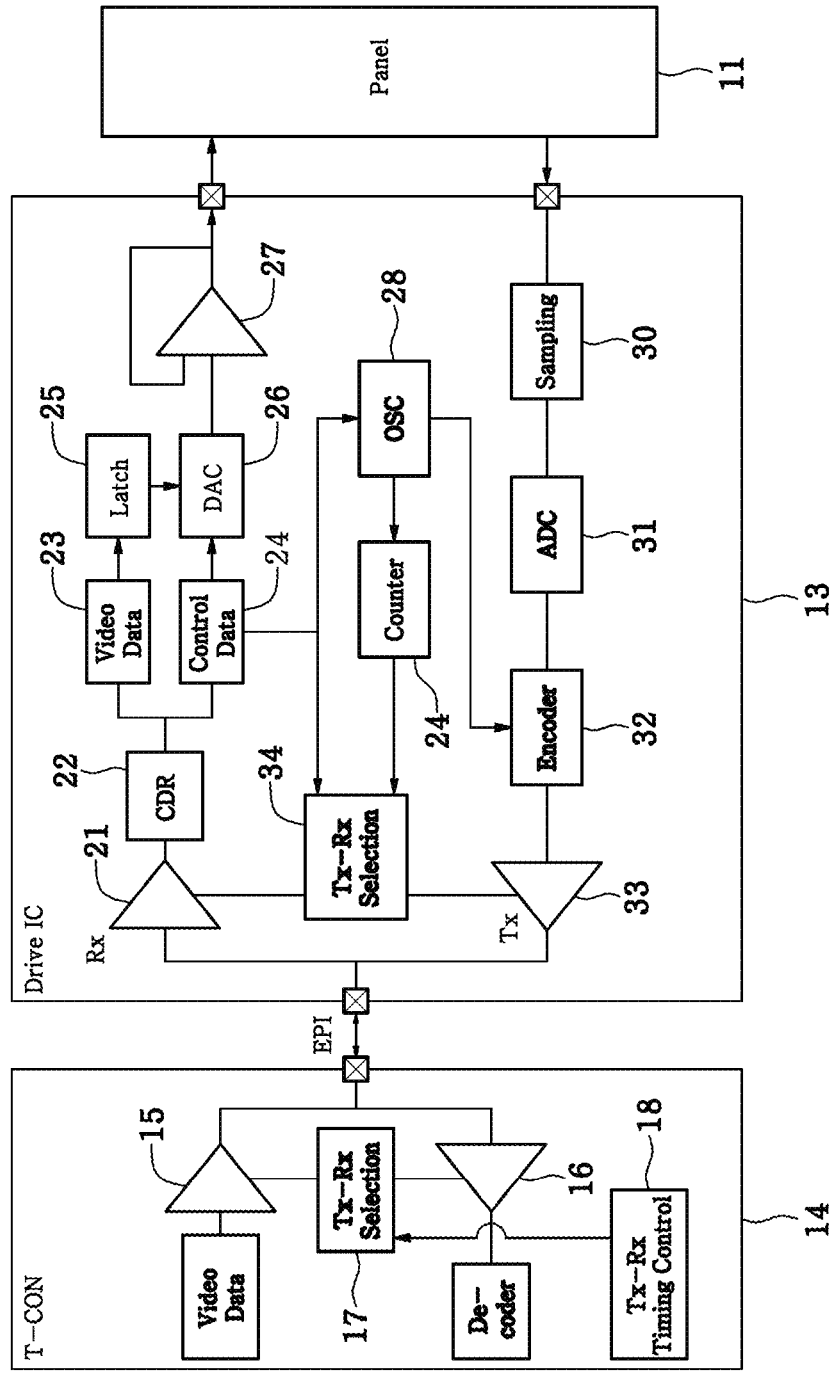
FIG. 5 is a block diagram showing a configuration of a timing controller and a data driver according to an aspect of the present disclosure.

FIG. 5 is a block diagram showing a configuration of a timing controller and a data driver according to an aspect of the present disclosure.

According to an aspect of the present disclosure, only an EPI interface exists between the timing controller 14 and the data driver 13 including a plurality of data driving ICs. There is no separate LVDS interface for transmitting the sensing value from each of the data driving ICs of the data driver 13 to the timing controller 14. That is, in an aspect of the present disclosure, the EPI interface communicates in both directions.

As shown in FIG. 5, the timing controller 14 according to an aspect of the present disclosure converts various control signals, image data, and clocks to a serial transmission packet (e.g., EPI transmission packet). The various control signals include a source start pulse, a source sampling clock, a source output enable signal, a vertical synchronization signal Vsyc, and a horizontal synchronization signal Hsyc.

The timing controller 14 includes a first transmission module 15 for transmitting the various control signals, the image data, and the clocks to each data driving IC of the data driver 13 via the EPI interface as the serial transmission packet, a first reception module 16 for receiving a sensing value from the each data driving IC of the data driver 13 via the EPI interface, a first transmission/reception selector 17 for enabling one of the first transmission module 15 and the first reception module 16 and disabling the other, and a transmission/reception timing controller 18 for outputting a control signal for controlling the first transmission/reception selector 17.

As shown in FIG. 5, each data driving IC of the data driver 13 according to an aspect of the present disclosure includes a second reception module 21, a clock data recovery unit 22, a video data processing unit 23, a latch unit 25, a control data processing unit 24, a digital/analog converter 26, an output unit 27, an oscillator 28, a sampling unit 30, an analog/digital converter 31, an encoder 32, a second transmission module 33, a counter 29, and a second transmission/reception selector 34.

Here, the second reception module 21 receives the serial transmission packet (e.g., EPI transmission packet) from the first transmission module 15 of the timing controller 14 through the EPI interface.

The clock data recovery unit 22 restores video data, control data, and a clock signal from the serial transmission packet.

The image data processing unit 23 processes the image data restored by the clock data recovery unit 22.

The latch unit 25 latches the image data processed by the image data processing unit 23.

The control data processing unit 24 processes the control data restored by the clock data recovery unit 22.

The digital/analog converter 26 converts the image data latched by the latch unit 25 into an analog image signal according to the control signal processed by the control data processing unit 24.

The output unit 27 supplies the analog image signal converted by the digital/analog converter 26 to each data line of the OLED panel 11.

The oscillator 28 is provided inside each data driving IC of the data driver 13 and generates a clock signal in accordance with the control signal processed by the control data processing unit 24.

The sampling unit 30 samples the sensing value sensed from the display panel 11.

The analog/digital converter 31 converts the sensing value sampled by the sampling unit 30 into a digital signal.

The encoder 32 encodes the digital sensing value from the analog/digital converter 31 in synchronization with the clock signal generated by the oscillator 28.

The second transmission module 33 converts the sensing value encoded by the encoder 32 into a transmission packet and transmits the transmission packet to the timing controller 14 through the EPI interface.

The counter 29 counts the clock signal generated from the oscillator 28 and outputs a control signal when the count value reaches a predetermined value.

The second transmission/reception selector 34 disables the second reception module 21 and enables the second transmission module 33 according to the control signal restored by the control data processing unit 24. Also, the second transmission/reception selector 34 disables the second transmission module 33 and enables the second reception module 21 according to the control signal of the counter 29.

The operation between the timing controller and the data driver according to an aspect of the present disclosure will now be described.

Figure 6:
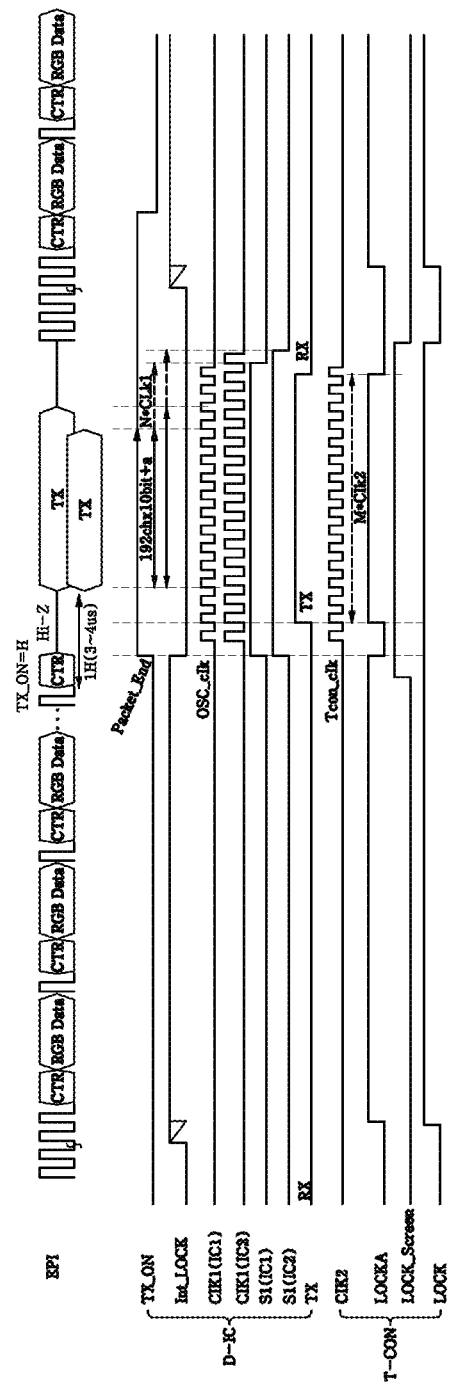
FIG. 6 is a timing diagram for explaining a communication method between the timing controller and the data driver according to an aspect of the present disclosure.

FIG. 6 is a timing diagram for explaining a communication method between the timing controller and the data driver according to an aspect of the present disclosure.

Firstly, in the serial transmission packet (e.g., EPI transmission packet) transmitted from the timing controller to each data driving IC, the control packet CTR and the video data RGB are repeated for one horizontal line during the active period of the vertical synchronization signal Vsync. Also, in the serial transmission packet (e.g., EPI transmission packet) transmitted from the timing controller to each data driving IC, a transmission mode packet Tx-ON is inserted into the control packet CTR at the start of a blank Vblank of the vertical synchronization signal Vsync, although not shown in the drawing, and an oscillator control signal is inserted into the control packet CTR at least one horizontal period before the transmission mode packet Tx-ON.

The transmission/reception timing control unit 18 of the timing controller 14 outputs a control signal to operate the first transmission module 15. And the first transmission/reception selector 17 of the timing controller 14 enables the first transmitting module 15 and disables the first reception module 16 according to the control signal from the transmission/reception timing control unit 18. Accordingly, the serial transmission packet (e.g., EPI transmission packet) signal is output from the first transmission module 15 of the timing controller 14 through the EPI interface to the second reception module 21.

Each data driving IC of the data driver 13 receives the serial transmission packet (e.g., EPI transmission packet) signal through the second reception module 21.

The clock data recovery unit 22 restores video data, control data, and a clock signal from the serial transmission packet (e.g., EPI transmission packet) signal received through the second reception module 21. The image data processing unit 23 processes the image data restored by the clock data recovery unit 22, and the control data processing unit 24 processes the control data restored by the clock data recovery unit 22.

The latch unit 25 latches the image data processed by the image data processing unit 23. The digital/analog converter 26 converts the image data latched by the latch unit 25 into an analog image signal according to the control signal processed by the control data processing unit 24, and outputs the analog image signal to each of data lines of the OLED panel 11 through the output unit 27.

Also, the control data processing unit 24 restores an oscillator control signal and enables the oscillator 28. Therefore, the oscillator 28 generates and outputs a clock signal.

Also, the control data processing unit 24 restores the transmission mode packet Tx-ON and outputs a transmission mode control signal to the second transmission/reception selector 34. Then, the second transmission/reception selector 34 disables the second reception module 21 and enables the second transmission module 33.

When the control data processing unit 24 restores the transmission mode packet Tx-ON and outputs the transmission mode control signal to the second transmission/reception selector 34, the transmission/reception timing control unit 18 of the timing controller 14 outputs a control signal to operate the first reception module 16, and the first transmission/reception selector 17 of the timing controller 14 disables the first transmission module 15 and enables the first reception module 16.

The sampling unit 30 samples the sensing value sensed from the display panel 11, the analog to digital converter 31 converts the sensing value sampled by the sampling unit 30 into a digital signal, and the encoder 32 encodes the digital sensing value from the analog-to-digital converter 31 in synchronization with the clock signal from the oscillator 28. The second transmission module 33 converts the sensing value encoded by the encoder 32 into a transmission packet and transmits the transmission packet to the first reception module 16 of the timing controller 14 through the EPI interface.

The first reception module 16 of the timing controller 14 receives the encoded sensing value through the EPI interface and restores the sensing value.

The timing controller 14 processes the sensing value to generate compensation values for compensating for a driving deviation of each pixel (threshold voltage deviation and mobility deviation of the driving TFT, and threshold voltage of the OLED, etc.), And the timing controller 14 compensates for pixel data to be supplied to each pixel using the compensation values, and outputs the compensated pixel data to each data driving IC of the data driver 13 via the EPI interface.

In this process, the counter 29 counts the clock signal from the oscillator 28 and outputs a control signal to the second transmission/reception selector 34 when the count value reaches a predetermined value, Thereby enabling the receiving module 21 and disabling the second transmitting module 33.

At the same time, the transmission/reception timing controller 18 of the timing controller 14 outputs a control signal to operate the first transmission module 15, and the first transmission/reception selector 17 enables the first transmitting module 15 and disables the first receiving module 16.

Accordingly, since the EPI interface can be bi-directionally communicated, the various control signals, the image data, and the clocks can be transmitted from the timing controller 14 to each data driving IC of the data driver, and the sensing value can be transmitted from each data driving IC of the data driver to the timing controller 14, through only the EPI interface.

Figure 7:
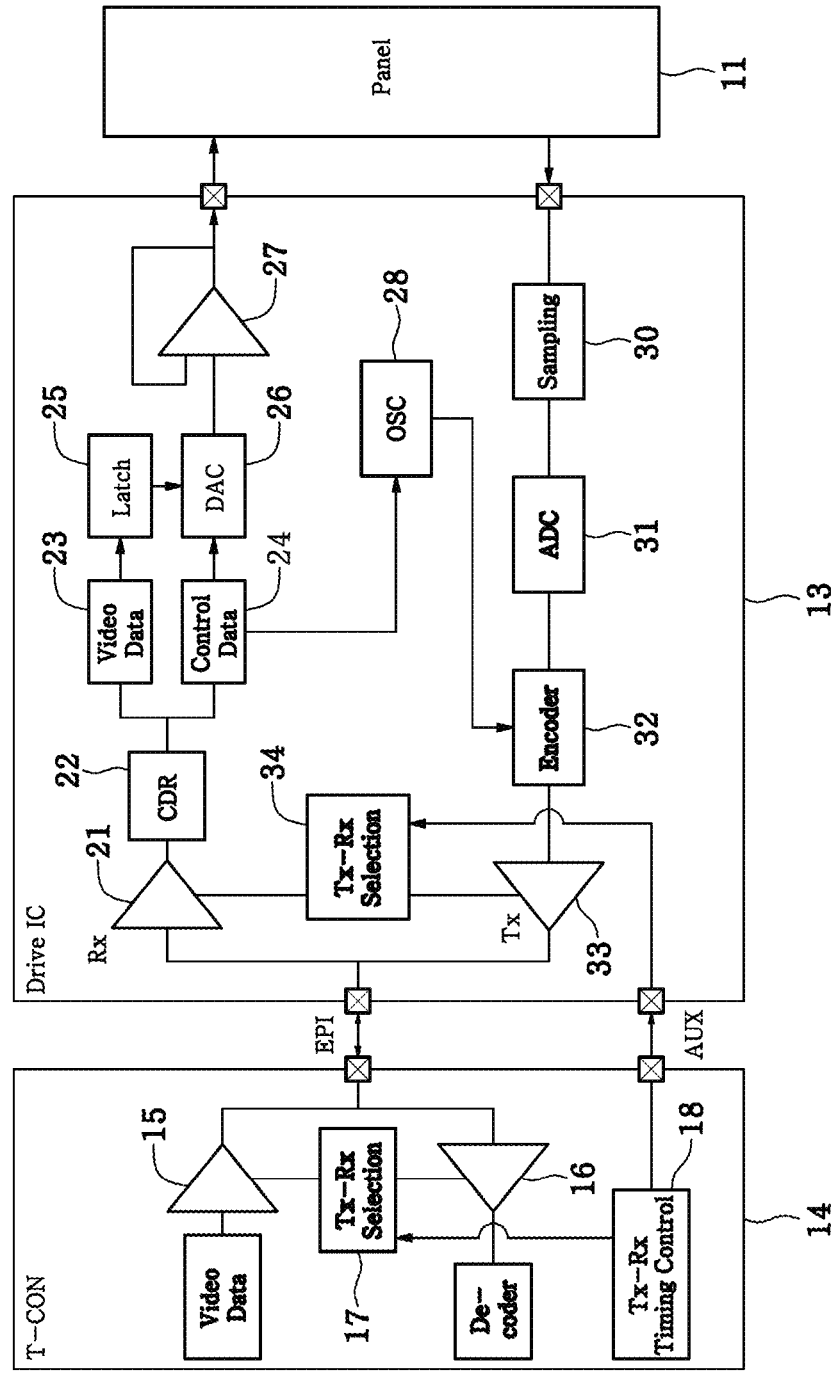
FIG. 7 is a block diagram showing a configuration of a timing controller and a data driver according to another aspect of the present disclosure.

FIG. 7 is a block diagram showing a configuration of a timing controller and a data driver according to another aspect of the present disclosure.

As shown in FIG. 7, only an EPI interface exists between the timing controller 14 and each of data driving ICs of the data driver according to another aspect of the present disclosure. There is no separate LVDS interface for transmitting the sensing value from each of the data driving ICs of the data driver to the timing controller 14.

However, the OLED display according to another aspect of the present disclosure further includes an auxiliary signal line (AUX) which transfers a control signal from the transmission/reception timing control unit 18 of the timing controller 14 to the second transmission/reception selector 34 of each data driving IC. Also, in the OLED display according to the second embodiment of the present invention, the EPI interface bi-directionally communicates.

Therefore, the configurations of the timing controller 14 and the data driver 13 according to another aspect of the present disclosure are similar to those of the aspect of the present disclosure, as shown in FIG. 5. However, since the first transmission/reception selector 17 of the timing controller 14 and the second transmission/reception selector 34 of each data driving IC are controlled by the transmission/reception timing control unit 18 of the timing controller 14, the counter 29 is not necessary in the configuration of the data driver 13 according to another aspect of the present disclosure.

As shown in FIG. 7, the timing controller 14 according to another aspect of the present disclosure converts various control signals, image data, and clocks to serial transmission packet (e.g., EPI transmission packet). The various control signals include a source start pulse, a source sampling clock, a source output enable signal, a vertical synchronization signal Vsyc, and a horizontal synchronization signal Hsyc.

The timing controller 14 according to another aspect of the present disclosure includes a first transmission module 15 for transmitting the various control signals, image data, and clocks as the serial transmission packet to each data driving IC of the data driver 13 via the EPI interface, a first reception module 16 for receiving a sensing value from the each data driving IC of the data driver 13 via the EPI interface, a first transmission/reception selector 17 for enabling one of the first transmission module 15 and the first reception module 16 and disabling the other, and a transmission/reception timing controller 18 for outputting a control signal for controlling the first transmission/reception selector 17 and the second transmission/reception selector 34 of each data driving IC.

As shown in FIG. 7, each data driving IC of the data driver 13 according to another aspect of the present disclosure includes a second reception module 21, a clock data recovery unit 22, a video data processing unit 23, a latch unit 25, a control data processing unit 24, a digital/analog converter 26, an output unit 27, an oscillator 28, a sampling unit 30, an analog/digital converter 31, an encoder 32, a second transmission module 33, and a second transmission/reception selector 34.

Here, the second reception module 21 receives the serial transmission packet (e.g., EPI transmission packet) from the first transmission module 15 of the timing controller 14 through the EPI interface.

The clock data recovery unit 22 restores video data, control data, and a clock signal from the serial transmission packet (e.g., EPI transmission packet).

The image data processing unit 23 processes the image data restored by the clock data recovery unit 22.

The latch unit 25 latches the image data processed by the image data processing unit 23.

The control data processing unit 24 processes the control data restored by the clock data recovery unit 22.

The digital/analog converter 26 converts the image data latched by the latch unit 25 into an analog image signal according to the control signal processed by the control data processing unit 24.

The output unit 27 supplies the analog image signal converted by the digital/analog converter 26 to each data line of the OLED panel 11.

The oscillator 28 is provided inside each data driving IC of the data driver 13 and generates a clock signal in accordance with the control signal processed by the control data processing unit 24.

The sampling unit 30 samples the sensing value sensed from the display panel 11.

The analog/digital converter 31 converts the sensing value sampled by the sampling unit 30 into a digital signal.

The encoder 32 encodes the digital sensing value from the analog/digital converter 31 in synchronization with the clock signal generated by the oscillator 28.

The second transmission module 33 converts the sensing value encoded by the encoder 32 into a transmission packet and transmits the transmission packet to the first reception module 16 of the timing controller 14 through the EPI interface.

The second transmission/reception selector 34 enables one of the second reception module 21 and the second transmission module 33 and disables the other according to the control signal from the transmission/reception timing controller 18 of the timing controller 14.

The operation between the timing controller and the data driver according to another aspect of the present disclosure will now be described.

Figure 8:
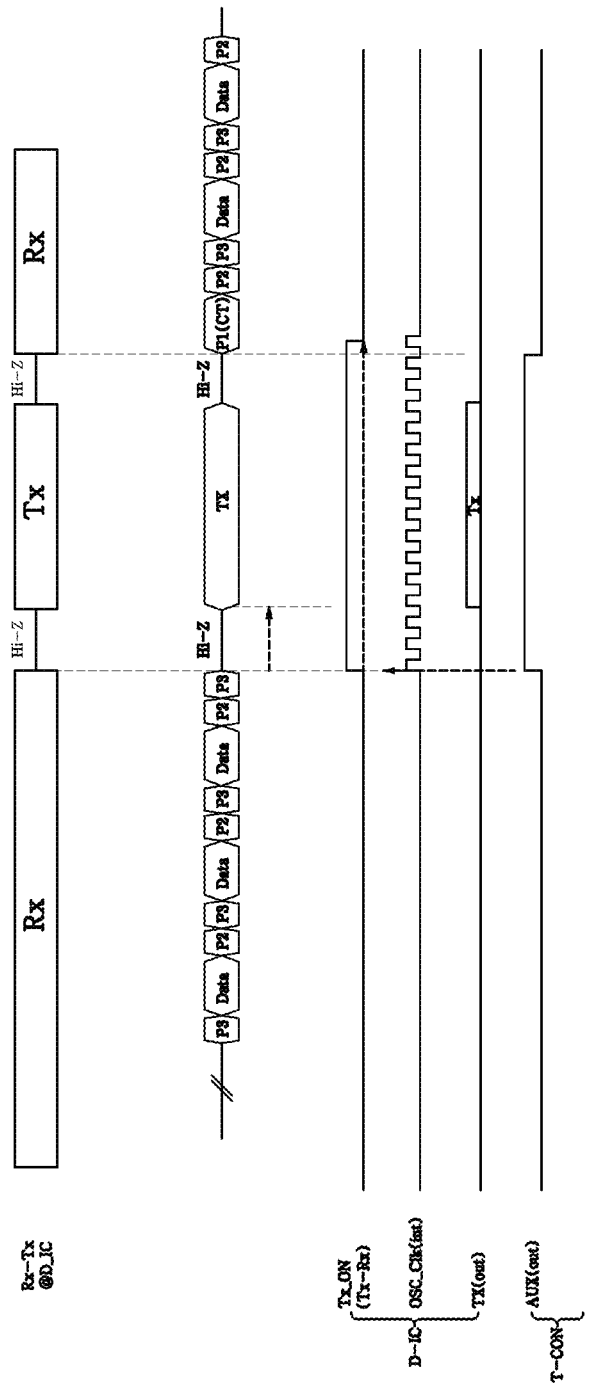
FIG. 8 is a timing diagram for explaining a communication method between the timing controller and the data driver according to another aspect of the present disclosure.

FIG. 8 is a timing diagram for explaining a communication method between the timing controller and the data driver according to another aspect of the present disclosure.

As described above, in the OLED display device according to another aspect of the present disclosure, both of the first transmission/reception selector 17 of the timing controller 14 and the second transmission/reception selector 34 of each data driving IC are controlled by the transmission/reception timing control unit 18 of the timing controller 14. Therefore, the operation of the remaining components according to another aspect of the present disclosure is the same as that of the aspect of the present disclosure as shown in FIG. 5 and will not be described. The operations of the first transmission/reception selector 17 of the timing controller 14 and the second transmission/reception selector 34 of each data driving IC will be described below.

In the serial transmission packet (e.g., EPI transmission packet), the control packet CTR and the video data RGB are repeated for one horizontal line during the active period of the vertical synchronization signal Vsync. Also, in the serial transmission packet (e.g., EPI transmission packet), although not shown in the drawing, an oscillator control signal is inserted into the control packet CTR at least one horizontal period.

However, since both of the first transmission/reception selector 17 of the timing controller 14 and the second transmission/reception selector 34 of each data driving IC are controlled by the transmission/reception timing control unit 18 of the timing controller 14, a transmission mode packet Tx-ON is not inserted into the control packet CTR at start of a blank Vblank of the vertical synchronization signal Vsync as in the aspect of the present disclosure shown in FIG. 5.

In another aspect of the present disclosure, in order to transmit the serial transmission packet (e.g., EPI transmission packet) from the timing controller 14 to each data driving IC, the transmission/reception timing controller 18 of the timing controller 14 controls the first transmission/The reception selector 17 to select the first transmission module 15, and controls the second transmission/reception selector 34 to select the second reception module 21. Accordingly, the first transmission/reception selector 17 enables the first transmission module 15 and disables the first reception module 16, and the second transmission/reception selector 34 enables the second receiving module 21 and disables the second transmitting module 33.

In this state, when the serial transmission packet (e.g., EPI transmission packet) signal is output from the first transmission module 15 of the timing controller 14 through the EPI interface, each data driving IC of the data driver 13 receives the serial transmission packet (e.g., EPI transmission packet) signal through the second reception module 21.

As described in the aspect of the present disclosure shown in FIG. 5, the image data, the control data, the clock signal, and the like are restored and processed, and are supplied to the respective data lines of the OLED panel 11 through the output unit 27.

In this way, video data of one vertical period is supplied to each data line. In another aspect of the present disclosure, in order to transmit the sensing value from each of the data driving ICs to the timing controller 14, the transmission/reception timing controller 18 of the timing controller 14 controls the first transmission/reception selector 17 to select the first reception module 16, and controls the second transmission/reception selector 34 to select the second transmission module 33. Accordingly, the first transmission/reception selector 17 enables the first reception module 16 and disables the first transmission module 15, and the second transmission/reception selector 34 enables the second transmitting module 33 and disables the second receiving module 21.

Also, the control data processing unit 24 restores an oscillator control signal and enables the oscillator 28. Therefore, the oscillator 28 generates and outputs a clock signal.

Accordingly, the sampling unit 30 samples the sensing value sensed from the display panel 11. The analog/digital converter 31 converts the sensing value sampled by the sampling unit 30 into a digital signal. The encoder 32 encodes the digital sensing value from the analog/digital converter 31 in synchronization with the clock signal from the oscillator 28. The second transmission module 33 converts the sensing value encoded by the encoder 32 into a transmission packet and transmits the transmission packet to the first reception module 16 of the timing controller 14 through the EPI interface.

The first reception module 16 of the timing controller 14 receives the encoded sensing value through the EPI interface and restores the sensing value.

The timing controller 14 processes the sensing value to generate compensation values for compensating for a driving deviation of each pixel (threshold voltage deviation and mobility deviation of the driving TFT, and threshold voltage of the OLED, etc.), And the timing controller 14 compensates for pixel data to be supplied to each pixel using the compensation values, and outputs the compensated pixel data to each data driving IC of the data driver 13 via the EPI interface.

Meanwhile, in the present invention, only an EPI interface exists between the timing controller 14 and each data driving IC of the data driver 13, and the sensing value is transmitted from each data driving IC to the timing controller 14 through the EPI interface. To do this, an oscillator must be installed inside each data driving IC.

However, a deviation may occur in the clock signal generated from the oscillator. Therefore, the deviation of the clock signals generated from the oscillator is to be eliminated.

Figure 9:
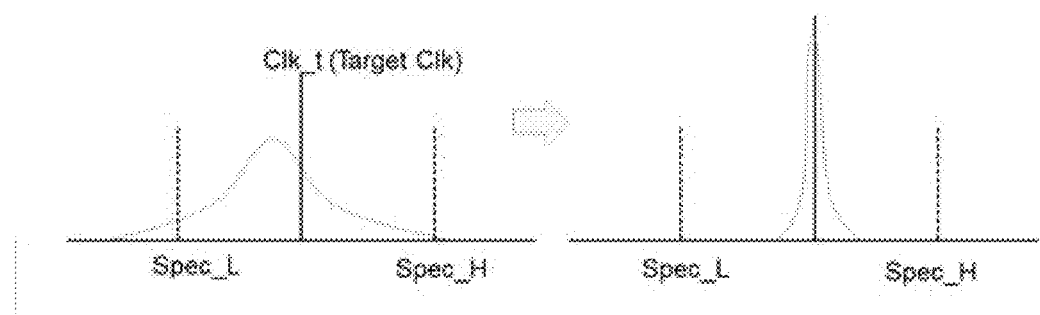
FIG. 9 is a diagram for explaining a method for correcting a clock frequency of an oscillator according to the present disclosure.

FIG. 9 is a diagram for explaining a method for correcting a clock frequency of an oscillator according to the present disclosure.

In order to solve the deviation of the clock signals generated from the oscillator, the OLED display of the aspect of the present disclosure shown in FIG. 5 is to be designed such that the frequency of the clock signal generated from the oscillator is externally correctable.

That is, each data driving IC has a terminal for checking a frequency of a clock signal generated from the oscillator, and the frequency of the clock signal generated from each oscillator is to be measured by a probe test in the data driving IC checking step. Then, the measured frequency is to be trimmed to a target clock.

Figure 10A:
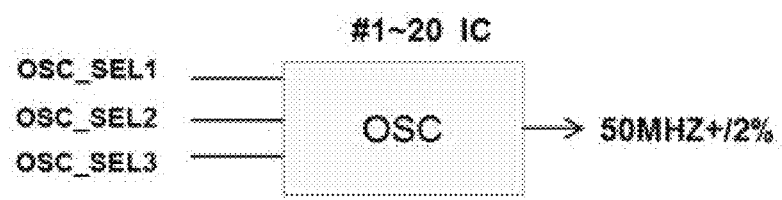
FIGS. 10A and 10B are diagrams for explaining a method for correcting the clock frequency of the oscillator according to the present disclosure.
Figure 10B:
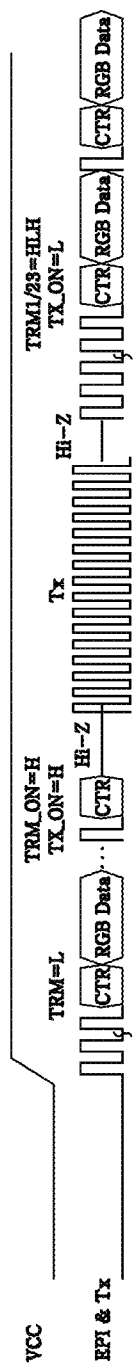

FIGS. 10A and 10B are diagrams for explaining a method for correcting the clock frequency of the oscillator according to the present disclosure.

The method for correcting the clock frequency of the oscillator according to the present disclosure is a method for correcting the clock frequency of the oscillator by using a packet to the data driving IC after the product is shipped.

That is, as shown in FIG. 10A, a plurality of selection terminals OSC_SEL1, OSC_SEL2, and OSX_SEL3 are provided in the oscillator 28 described in FIG. 5 and FIG. 7.

A trimming interval is allocated at the time of power on, and the timing controller 14 measures the clock frequency from the oscillator 28 for the trimming interval by using an internal fine clock. Then, as shown in FIG. 10B, an adjustment value (i.e., TRM 123 packet) for adjusting the clock frequency from the oscillator 28 is inserted into the EPI transmission packet, and the EPI transmission packet is transmitted to each data driving IC.

That is, as shown in FIG. 10A, when the oscillator 28 is provided with three selection terminals OSC_SEL1, OSC_SEL2, and OSX_SEL3, the adjustment value can be adjusted by 3 bits (e.g., 000-111, 8 steps).

As shown in FIG. 10A, if the adjustment value (e.g., TRM 123 packet=HLH) is inserted, the clock data recovery unit 22 restores video data, control data, a clock signal, and the like from the EPI transmission packet signal received through the second reception module 21. The video data processor 23 processes the video data restored by the clock data recovery unit 22, and the control data processor 24 processes the control data restored by the clock data recovery unit 22.

The latch unit 25 latches the image data processed by the image data processing unit 23. The digital/analog converter 26 converts the image data latched by the latch unit 25 into an analog image signal according to the control signal processed by the control data processing unit 24, and outputs the analog image signal to each of data lines of the OLED panel 11 through the output unit 27.

The control data processing unit 24 restores an oscillator control signal and enables the oscillator 28. Therefore, the oscillator 28 generates and outputs a clock signal. Also, the control data processing unit 24 restores the adjustment value (e.g., TRM123 packet=HLH) and sets the selection terminals OSC_SEL1, OSC_SEL2, and OSX_SEL3 of the oscillator 28. For example, if the adjustment value is "TRM 123 packet=HLH", "1", "0", "1" are set to each of the selection terminals of the oscillator 28, Therefore, the oscillator 28 outputs the clock signal having a frequency corresponding to the value set at the selection terminal.

After the product is shipped, since the clock frequency of the oscillator can be adjusted by this method, the deviation of the clock signals generated from each oscillator provided in each data driving IC can be eliminated.

Since the clock frequency of the oscillator can be adjusted even after shipment by such a method, deviation of clock signals generated in each oscillator provided in each data driving IC can be eliminated.

Figure 11:
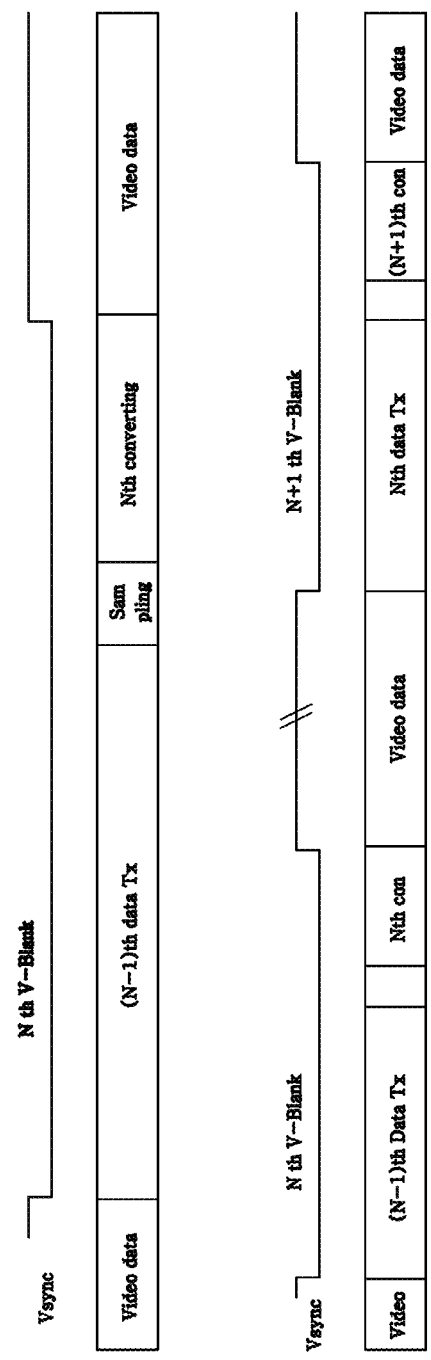
FIG. 11 is a timing diagram for explaining the transmission timing of a sensing value according to the present disclosure.

FIG. 11 is a timing diagram for explaining the transmission timing of a sensing value according to the present invention.

Conventionally, the timing controller transmits the video signal to each data driving IC of the data driver through the EPI interface known as a high-speed serial interface, The driving IC transmits the sensing value to the timing controller through a separate LVDS interface. Therefore, conventionally, the sensing value is converted into a digital signal at the time of a blank V-blank of a vertical synchronizing signal, and then the digital sensing value is transmitted to the timing controller 14 at a blank interval V-blank or a data transmission interval of the vertical synchronizing signal.

However, as shown in FIG. 11, since the present disclosure does not use the separate LVDS interface, each data driving IC transmits the (n−1)-th sensing value to the timing controller, samples the (N)-th sensing value, and converts the sampled (N)-th sensing value into a digital signal, at the (n)-th blank interval of the vertical synchronizing signal. Also, each data driving IC transmits the (n)-th sensing value to the timing controller, samples the (N+1)-th sensing value, and converts the (N+1)-th sampled sensing value into a digital signal, at the (n+1)-th blank interval of the vertical synchronizing signal.

In the aspects of the present disclosure, the oscillator in each data driving IC generates a clock signal, and each data driving IC transmits the sensing value to the timing controller by a clocked embedded transmission method using the clock signal. However, the present disclosure is not limited to this, and can be transmitted in the Manchester code format.

Figure 12A:
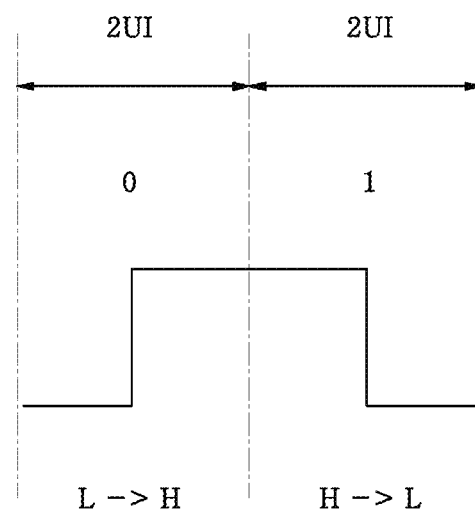
FIG. 12A is a diagram for explaining the Manchester code.
Figure 12B:
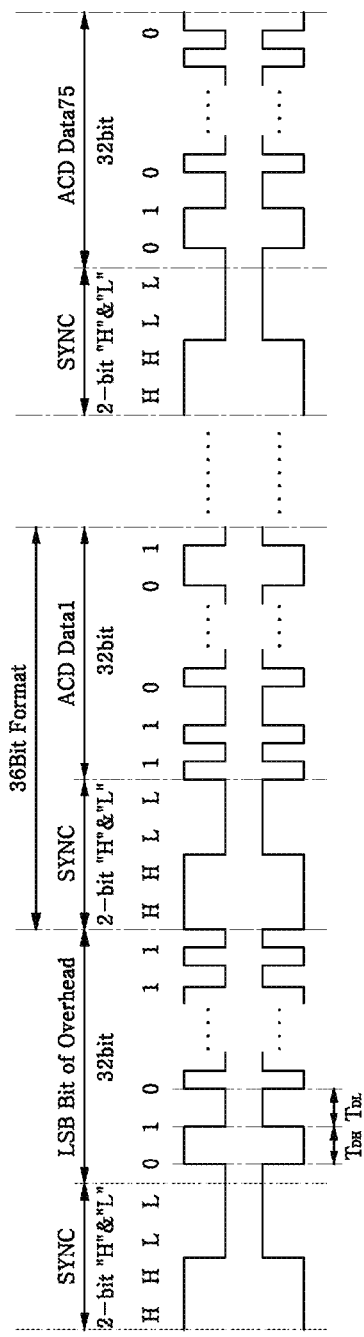
FIG. 12B is a timing diagram for explaining that a phase signal can be transmitted between differential signals by using a synchronization signal.

FIG. 12A is a diagram for explaining the Manchester code, and FIG. 12B is a timing diagram for explaining that a phase signal can be transmitted between differential signals by using a synchronization signal.

As shown in FIG. 12A, the Manchester code is a system in which data and a timing signal are combined into one bit stream and the combined signal is transmitted.

That is, binary 0 transitions from low (L) to high (H) at the center of the bit interval, and binary 1 transitions from high (H) to low (L) at the center of the bit interval. The Manchester code is transmitted using the clock signal generated from the oscillator in each of the data driving ICs.

As shown in FIG. 12B, when data is transmitted in the Manchester coding scheme, the data may be transmitted as a difference signal, and a phase may be adjusted between data using a synchronization signal SYNC.

As is apparent from the above description, according to the present disclosure, there are advantages as below.

First, since the sensing value can be transmitted from each data driving IC to the timing controller through the EPI interface without forming a separate line (B-LVDS), the size of the control PCB can be reduced.

Second, since the sensing value can be transmitted from each data driving IC to the timing controller through the EPI interface without forming a separate line (B-LVDS), the number of pins of the timing controller can be reduced and the number of FFC pins can be reduced.

Third, since a clock signal is generated by an oscillator installed in each data driving IC, and a sensing value is transmitted by using the clock signal, a clock deviation may occur for each data driving IC. However, since a frequency of the clock signal can be adjusted by trimming and using packets, the yield of the OLED display device can be improved, and the quality of the OLED display device can be improved.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. An organic light emitting display device comprising:
a display panel having a plurality of gate lines and data lines;
a timing controller controlling an operation timing of each pixel;
a gate driver driving the gate lines;
a data driver having a plurality of data driving integrated circuits driving the data lines; and
an embedded point-to-point interface between the timing controller and each of the data driving integrated circuits,
transmitting video/control data signal from the timing controller to each of the data driving integrated circuits and transmitting a sensing value from the data driving integrated circuits to the timing controller,
wherein the timing controller comprises;
a first transmission module transmitting video/control data signal to each of the data driving integrated circuits via the embedded point-to-point interface,
a first reception module receiving the sensing value from each of the data driving integrated circuits via the embedded point-to-point interface, a first transmission/reception selector enabling one of the first transmission module and the first reception module, and disabling the other of non-enabled module, and a transmission/reception timing controller controlling the first transmission/reception selector, and wherein each of data driving integrated circuits comprises;

a second reception module receiving the video/control data signal from the timing controller through the embedded point-to-point interface;

a clock data recovery unit restoring video data, control data, and a clock signal from the video/control data signal received through the second reception module;

an oscillator generating the clock signal in accordance with the restored control signal;

an encoder encoding the sensing value sensed from the display panel in synchronization with the clock signal generated by the oscillator;

a second transmission module converting the sensing value encoded by the encoder into a transmission packet and transmitting the transmission packet to the timing controller through the embedded point-to-point interface;

a counter counting the clock signal generated from the oscillator and outputting a control signal when a counted value reaches a predetermined value; and a second transmission/reception selector disabling the second reception module and enabling the second transmission module according to the control signal restored by the control data processing unit, and disabling the second transmission module and enabling the second reception module according to the control signal of the counter.

2. The organic light emitting display device according to claim 1, wherein each of the data driving integrated circuits has an oscillator generating a clock signal to transmit the sensing value to the timing controller through the embedded point-to-point interface.

3. The organic light emitting display device according to claim 1, wherein each of the data driving integrated circuits comprises:
   an image data processing unit processing the image data restored by the clock data recovery unit;
   a latch unit latching the image data processed by the image data processing unit;
   a control data processing unit processing the control data restored by the clock data recovery unit, and supplying the control data to the counter and the oscillator;
   a digital/analog converter converting the latched image data into an analog image signal according to the control signal processed by the control data processing unit; and
   an output unit supplying the analog image signal to each data line of the display panel.

4. The organic light emitting display device according to claim 3, wherein each of the data driving integrated circuits comprises:
   a sampling unit sampling the sensing value sensed from the display panel; and
   an analog/digital converter converting the sensing value sampled by the sampling unit into a digital sensing value, and supplying the digital sensing value to the encoder.

5. The organic light emitting display device according to claim 1, further comprising:

an auxiliary signal line transferring the control signal from the transmission/reception timing control unit to each of the data driving integrated circuits, wherein each of the data driving integrated circuits comprise;

a second reception module receiving video/control data signals from the timing controller through the embedded point-to-point interface;

a clock data recovery unit restoring video data, control data, and a clock signal from the video/control data signal received through the second reception module;

an oscillator generating the clock signal in accordance with the control signal restored by the clock data recovery unit;

an encoder encoding a sensing value sensed from the display panel in synchronization with the clock signal generated by the oscillator;

a second transmission module converting the sensing value encoded by the encoder into a transmission packet and transmitting the transmission packet to the first reception module of the timing controller through the embedded point-to-point interface;

a second transmission/reception selector receiving the control signal from the transmission/reception timing controller through the auxiliary signal line, and enabling one of the second reception module and the second transmission module and disabling the other of non-enabled module according to the control signal from the transmission/reception timing controller.

6. The organic light emitting display device according to claim 5, wherein each of the data driving integrated circuits comprises:
   an image data processing unit processing the image data restored by the clock data recovery unit;
   a latch unit latching the image data processed by the image data processing unit;
   a control data processing unit processing the control data restored by the clock data recovery unit, and supplying the processed control data to the oscillator;
   a digital/analog converter converting the latched image data into an analog image signal according to the control signal processed by the control data processing unit; and
   an output unit supplying the analog image signal converted by the digital/analog converter to each of the data lines of the display panel.

7. The organic light emitting display device according to claim 6, wherein each of the data driving integrated circuits comprises;
   a sampling unit sampling the sensing value sensed from the display panel; and
   an analog/digital converter converting the sampled sensing value into a digital sensing value, and supplying the digital sensing value to the encoder.

8. The organic light emitting display device according to claim 1, wherein the timing controller and each of the data driving integrated circuits communicate with each other via the embedded point-to-point interface under the Manchester coding scheme.

9. An organic light emitting display device, comprising:
   a display panel having a plurality of pixels, gate lines and data lines;
   a timing controller outputting a video/control data signal;
   a gate driver driving the gate lines;
   a data driver driving the data lines and outputting a sensing value of the pixels to compensate for the video/control data signal; and an embedded point-to-point interface connected between the timing controller and the data driver, wherein both of the video/control data signal and the sensing value are respectively transmitted to the data driver and the timing controller through the embedded point-to-point interface, wherein the timing controller comprises:

a first transmission module transmitting the video/control data signal to the data driver through the embedded point-to-point interface;

a first reception module receiving the sensing value from the data driver through the embedded point-to-point interface;

a first transmission/reception selector enabling one of the first transmission module and the first reception module, and disabling the other of non-enabled module; and a transmission/reception timing controller controlling the first transmission/reception selector, and wherein the data driver comprises:

a second reception module for receiving the video/control data signal from the timing controller through the embedded point-to-point interface;

a clock data recovery unit restoring video data, control data, and a clock signal from the video/control data signal received through the second reception module;

an oscillator generating the clock signal in accordance with the control signal restored by the clock data recovery unit;

an encoder encoding a sensing value sensed from the display panel in synchronization with the clock signal generated by the oscillator;

a second transmission module for converting the sensing value encoded by the encoder into a transmission packet and transmitting the transmission packet to the first reception module of the timing controller through the embedded point-to-point interface; and a second transmission/reception selector receiving the control signal from the transmission/reception timing controller through an auxiliary signal line, and enabling one of the second reception module and the second transmission module and disabling the other of non-enabled module according to the control signal from the transmission/reception timing controller.

10. The organic emitting display device according to claim 9, wherein the data driver comprises a plurality of data driving integrated circuits.

11. The organic emitting display device according to claim 10, wherein the data driving integrated circuits have an oscillator generating a clock signal to transmit the sensing value to the timing controller.

12. The organic emitting display device according to claim 11, further comprising a counter counting the clock signal generated from the oscillator and outputting a control signal when a counted value reaches a predetermined value.

13. The organic light emitting display device according to claim 9, further comprising an auxiliary signal line to transfer the control data signal to the data driver.

14. The organic light emitting display device according to claim 9, wherein the data driver comprises:

an image data processing unit processing the image data restored by the clock data recovery unit;

a latch unit latching the image data processed by the image data processing unit;

a control data processing unit processing the control data restored by the clock data recovery unit, and supplying the processed control data to the oscillator;

a digital/analog converter converting the latched image data into an analog image signal according to the control signal processed by the control data processing unit; and an output unit supplying the analog image signal converted by the digital/analog converter to each of the data lines of the display panel.

15. The organic light emitting display device according to claim 14, wherein the data driver comprises:

a sampling unit sampling the sensing value sensed from the display panel; and an analog/digital converter converting the sampled sensing value into a digital sensing value, and supplying the digital sensing value to the encoder.

16. The organic light emitting display device according to claim 9, wherein the timing controller and the each of the data driving integrated circuits communicate with each other through the embedded point-to-point interface under the Manchester coding scheme.

\* \* \* \* \*